United States Patent [19]

Matsushita

[11] Patent Number: 4,849,944
[45] Date of Patent: Jul. 18, 1989

[54] CONNECTING STRUCTURE FOR CONNECTING A MEMORY UNIT TO A MEMORY UNIT CONTROLLER

[75] Inventor: Tsuyoshi Matsushita, Shizuoka, Japan

[73] Assignee: Tokyo Electric Company, Ltd., Tokyo, Japan

[21] Appl. No.: 85,187

[22] Filed: Aug. 14, 1987

[30] Foreign Application Priority Data

Aug. 18, 1986 [JP] Japan ................ 61-192558

[51] Int. Cl.$^4$ .................... G11C 7/00; H01R 23/18
[52] U.S. Cl. .................... 371/21; 365/226;
365/189.01; 365/201; 365/244; 439/60
[58] Field of Search ............ 365/189, 230, 228, 229,
365/1, 2, 51, 54, 226; 339/17 L, 17 LM; 439/59,
60, 61, 62

[56] References Cited

U.S. PATENT DOCUMENTS 4,220,991 9/1980 Hamano et al. .............. 364/405
4,607,351 8/1986 Gerber et al. .............. 365/228

FOREIGN PATENT DOCUMENTS 49-128264 12/1974 Japan .
50-27692 9/1975 Japan .
60-10524 6/1985 Japan ................ 365/229
2126021A 3/1984 United Kingdom .

*Primary Examiner*—Terrell W. Fears
*Assistant Examiner*—Melissa J. Koval
*Attorney, Agent, or Firm*—Oblon, Spivak, McClelland, Maier & Neustadt

[57] ABSTRACT

Grounding terminals of a memory unit are disposed at the opposite ends of an array of signal terminals of the memory unit, respectively, reception grounding terminals of a connector are disposed at the opposite ends of any array of reception signal terminals of the connector, respectively, the grounding terminals of the memory unit are connected to the reception grounding terminals of the connector, respectively, before the signal terminals of the memory unit are connected to the reception signal terminals of the connector in inserting the memory unit in the connector. Upon the insertion of the memory unit in the connector, the static electricity accumulate in the memory unit is discharged surely to a ground without affecting the semiconductor memory of the memory unit through the signal terminals and the reception signal terminals.

14 Claims, 2 Drawing Sheets

CONNECTING STRUCTURE FOR CONNECTING A MEMORY UNIT TO A MEMORY UNIT CONTROLLER

FIELD OF THE INVENTION AND RELATED ART STATEMENT

The present invention relates to a memory unit having a semiconductor memory for storing information such as data and/or sentences and a memory unit controller which communicates with the memory unit and, more particularly, to a connecting structure for connecting such a memory unit to the connector of a memory unit controller.

Conventionally, a memory unit having a semiconductor memory is inserted in a connector connected to a control circuit to connect the semiconductor memory electrically to the control circuit for writing information in or for reading information from the semiconductor memory of the memory unit. When the memory unit is inserted in the connector, the memory unit is connected to the control circuit through numerous terminals. These terminals are classified roughly into signal terminals through which signals are transmitted, and grounding terminals. The signal terminals are classified roughly into information signal terminals and check terminals. Signals carrying information to be written in or read from the memory unit are transmitted through the information signal terminals. Some of these information signal terminals are used for connecting the memory unit to a power source. The check terminals are used for checking whether or not the memory unit is connected surely to the connector.

Such a conventional connecting structure has the following disadvantages. When a memory unit is handled by an operator, in some cases, the operator or the memory unit is charged with static electricity, and thereby a potential difference is produced between the memory unit and the connector. Accordingly, it is possible that the static electricity accumulated in the operator or the memory unit is discharged through the semiconductor memory of the memory unit upon the insertion of the memory unit in the connector to destroy the semiconductor memory or the contents of the semiconductor memory. To avoid such an accident, it is usual to provide the memory unit and the connector with grounding terminals to discharge static electricity to a ground. However, it is possible that static electricity is discharged through the signal terminals of the memory unit and the connector, and the semiconductor memory before the static electricity is discharged through the grounding terminals. Thus, the prior art is unable to prevent the destruction of the semiconductor memory perfectly. The terminals of the memory unit and those of the connector are arranged in a line so that, in principle, all the terminals of the memory unit are connected simultaneously to the corresponding terminals of the connector. Actually, the terminals of the memory unit are not connected simultaneously to those of the connector, and hence the foregoing accident is liable to occur. For example, when the memory unit is inserted in the connector slightly obliquely, simultaneous connection of the terminals of the memory unit to those of the connector is impossible.

In electrically connecting a memory unit to a control circuit through numerous terminals by inserting the memory unit in a connector, the terminals must surely be connected electrically for correct information transmission between the memory unit and the control circuit. Conventionally, the memory unit and the connector are provided with check terminals, and it is inferred from the connection of the check terminals that the rest of the terminals are connected correctly. However, when the memory unit is inserted obliquely in the connector, for instance, it is possible that some terminals are not connected even if the check terminals are connected. Accordingly, if information is transmitted between the memory unit and the control circuit with the terminals incorrectly connected, precise transmission of the information is impossible and the variation or destruction of the contents of the memory unit is possible. The contents of a static RAM of the C-MOS structure, in particular, is likely to be destroyed when information is transmitted between the static RAM and the control circuit with the power supply terminals disconnected.

OBJECT AND SUMMARY OF THE INVENTION

Accordingly, it is a first object of the present invention to provide a connecting structure for connecting a memory unit to a memory unit controller, capable of surely discharging static electricity accumulated in the memory unit to a ground upon the insertion of the memory unit in a connector.

It is a second object of the present invention to provide a connecting structure for connecting a memory unit to a memory unit controller, which enables accurate check of the state of connection of the memory unit and a connector.

To achieve the foregoing objects of the invention, the present invention provides a connecting structure for connecting a memory unit to a memory unit controller, which comprises: a plurality of reception signal terminals connected to a control circuit; reception grounding terminals disposed at opposite ends, respectively, of the array of the reception signal terminals; the reception signal terminals and the reception grounding terminals being provided in a connector; signal terminals to be connected to the reception signal terminals of the connector, respectively; grounding terminals to be connected to the reception grounding terminals of the connector, disposed at the opposite ends of the array of the signal terminals; the signal terminals and the grounding terminals being provided in the memory unit; and relative position between the terminals is designed so that the grounding terminals are connected to the reception grounding terminals, respectively, before the signal terminals are connected to the corresponding reception signal terminals, respectively. Therefore, even if the memory unit is inserted obliquely in the connector, the grounding terminals are connected to the reception grounding terminals before the signal terminals are connected to the reception signal terminals. Accordingly, the static electricity accumulated in the memory unit is discharged surely to a ground upon the insertion of the memory unit in the connector without being discharged to the semiconductor memory of the memory unit.

When the terminals are arranged so that the check terminals among the signal terminals of the memory unit are connected to the reception check terminals among the reception signal terminals of the connector, respectively, after the rest of the terminals have been interconnected, the complete connection of the terminals can be known from the connection of the check terminals and the reception check terminals. Accordingly, it is possible to detect accurately whether or not the memory unit is connected correctly to the connector.

DESCRIPTION OF THE PREFERRED EMBODIMENTS

Figure 1:
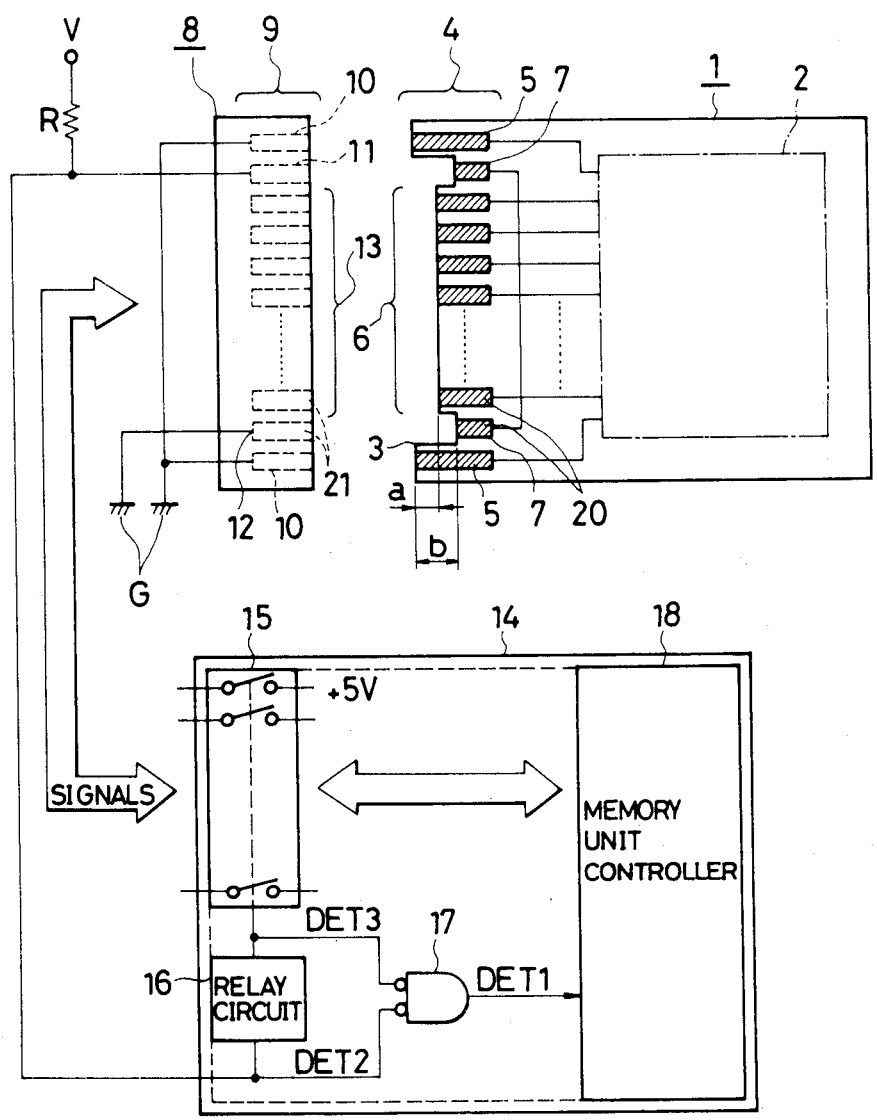
FIG. 1 is a block diagram showing the state of connection of a memory unit incorporating a connecting structure, in a first embodiment, according to the present invention and an electronic equipment.
Figure 2:
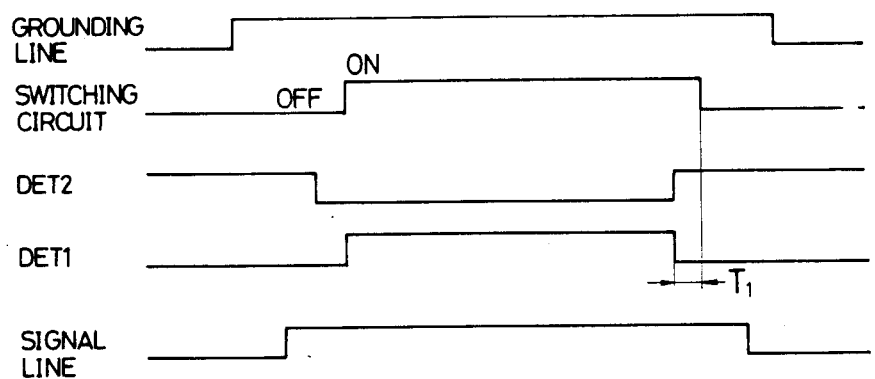
FIG. 2 is a time chart showing the respective timings of signals transmitted between the memory unit and electronic equipment of FIG. 1.

A first embodiment of the present invention will be described with reference to FIGS. 1 and 2. A rectangular memory unit 1 is provided with a semiconductor memory 2. A terminal array 4 is formed on one side 3 of the memory unit 1. The terminal array 4 includes a pair of grounding terminals 5 disposed at the opposite ends of the terminal array 4, a pair of check terminals 7 disposed inside the grounding terminals 5, respectively, and a plurality of information signal terminals 6 arranged in a line between the pair of check terminals 7. The outer extremities of the grounding terminals 5 are flush with the side 3 of the memory unit 1, the outer extremities of the information signal terminals 6 are flush with a line extending in parallel to and back by a distance a from the side 3, and the outer extremities of the check terminals 7 are flush with a line extending in parallel to and back by a distance b from the side 3, in which a<b. The grounding terminals 5 and the information signal terminals 6 are connected electrically to the semiconductor memory 2, and the check terminals 7 are short-circuited. The information signal terminals 6 and the check terminals 7 a group of signal terminals 20.

The memory unit 1 is inserted in a connector 8. The connector 8 is provided with a terminal array 9 including two reception grounding terminals 10 corresponding to the grounding terminals 5 of the memory unit 1, a plurality of reception information signal terminals 13 corresponding to the information signal terminals 6 of the memory unit 1, and two reception check signal terminals 11 and 13 corresponding to the check terminals 7 of the memory unit 1. The reception grounding terminals 10, the reception information signal terminals 13 and the reception check signal terminals 11 and 12 are arranged along a straight line. The two reception grounding terminals 10 and the reception check signal terminal 12 among the two reception check signal terminals are connected to grounds G, respectively, and the rest of the terminals of the connector 8 are connected to an electronic equipment 14, which will be described hereinafter. The reception check signal terminals 11 and 12, and the reception information signal terminals 13 are included in a group of reception signal terminals 21.

The electronic equipment 14 comprises a switching circuit 15, a delay circuit 16, a gate circuit 17, and a memory unit controller 18, namely, a control circuit. The memory unit controller 18 is connected through the switching circuit 15 to the connector 8. The switching circuit 15 is connected to the reception check signal terminal 11, and to the output terminal of the delay circuit 16, which in turn is connected through a resistor R to a power source V. The input terminal and output terminal of the delay circuit 16 are connected to the input terminals of the gate circuit 17, respectively. The output terminal of the gate circuit 17 is connected to the memory unit controller 18.

The memory unit controller 18 is provided internally with a power source to supply power through the switching circuit 15 to one of the reception information signal terminals 13.

A mode of connection of the terminals of the connector 8 and the memory unit 1 in inserting the memory unit 1 in the connector 8 will be described hereunder. As shown in FIG. 1, the information signal terminals 6 are arranged back by the distance a from the grounding terminals 5 aligned with the side 3 of the memory unit 1, and the check terminals 7 are arranged back by the distance b from the grounding terminals 5 (a<b). In inserting the memory unit 1 in the connector 8, the grounding terminals 5 disposed at the opposite ends, respectively, of the terminal array 4 are connected to the reception grounding terminals 10 of the connector 8, respectively, before the rest of the terminals of the memory unit 1 are connected to the rest of the reception terminals of the connector 8. Then, as the memory unit 1 is inserted further in the connector 8, the information signal terminals 6 of the memory unit 1 are connected to the reception information signal terminals 13 of the connector 8 and, finally, the check terminals 7 of the memory unit 1 are connected to the reception check terminals 11 and 12 of the connector 8, respectively. Thus, the terminals of the memory unit 1 are connected sequentially to those of the connector 8. In extracting the memory unit 1 from the connector 8, the terminals are disconnected in the reverse sequence, namely, the check terminals 1 and 12 are disconnected first from the reception check terminals 11 and 12, and the grounding terminals 5 of the connector 1 are disconnected last from the reception grounding terminals 10 of the connector 8.

Although the timings of connection and disconnection varies between the terminals, the terminals are connected and disconnected always with the grounding terminals 5 of the memory unit 1 connected to the reception grounding terminals 10 of the connector 8. Accordingly, upon the insertion of the memory unit 1 in the connector 8, the static electricity accumulated in the memory unit 1 is discharged to the ground G without fail before the signal terminals 20 are connected to the reception signal terminals 21. Consequently, the semiconductor memory 2 per se and the contents of the semiconductor memory 2 are surely protected. Since the check terminals 7 are connected last to the reception check terminals 11 and 12, the connection of the rest of the terminals is confirmed through the detection of the connection of the check terminals 7 and the reception check terminals 11 and 12. Therefore, information transmission with the memory unit 1 connected incorrectly to the connector 8 is avoided, so that erroneous write operation and erroneous read operation are obviated.

The electrical function of the connecting structure thus formed will be described hereinafter with reference to a time chart shown in FIG. 2. In inserting the memory unit 1 in the connector 8, first, the grounding terminals 5 are connected to the reception grounding terminals 10, so that a grounding line becomes conductive. Then, the information signal terminals 6 are connected to the reception information signal terminals 13, so that signal lines become conductive. However, at this moment, since the switching circuit 15 is open, the signal lines remains disconnected from the memory unit controller 18. Thereafter, the check terminals 7 are connected to the reception check terminals 11 and 12, whereby the potential of a detection signal DET2 changes from high level to low level. The detection signal DET2 of low level is transmitted to the delay circuit 16, and then the delay circuit 16 provides a delayed signal DET3 to turn on the switching circuit 15, and thereby the information signal terminals 13 are connected through the signal lines to the memory unit controller 18. At the same time, a detection signal DET1, which is the logical product of the detection signal DET2 and the delayed signal DET3, is given to the memory unit controller 18 to actuate the memory unit controller 18. That is, the switching circuit 15 is turned on to connect the signal lines to the memory unit controller 18 and to actuate the memory unit controller 18 with a moment's delay from the connection of the signal lines to the memory unit controller 18. Accordingly, the memory unit controller 18 confirms the secure connection of the memory unit 1 to the connector 8 through monitoring the detection signal DET1, namely, the logical product of the detection signal DET2 and the delayed signal DET3 obtained by delaying the detection signal DET2, and then controls the memory unit 1 for data write operation.

On the other hand, in extracting the memory unit 1 from the connector, the memory unit controller 18 monitoring the detection signal DET1 detects the memory unit 1 being extracted from the connector 8 when the check terminals 7 are disconnected from the reception check terminals 11 and 12 through the detection of the variation of the detection signal DET1 resulting from the change of the detection signal DET2. In a time period corresponding to a time necessary for the movement of the memory unit 1 relative to the connector 8 through a distance b - a from a moment of change of the detection signal DET1 from high level to low level to a moment of separation of the information signal terminals 6 from the reception information signal terminals 13, floating data can be processed to avoid the floating data being disordered. In FIG. 2, a time T1 in which the memory unit 1 is extracted from the connector 8 to change the detection signal DET1 from high level to low level and thereby the signal lines are disconnected by the switching circuit 15, and a time T2 necessary for writing data meet an inequality: T1>T2.

The application of the present invention is not limited to the memory unit 1 such as a memory card, a ROM cartridge or a connectable printed circuit board provided with a memory, and the present invention is applicable to all kinds of memory units of the same or similar construction.

Figure 3:
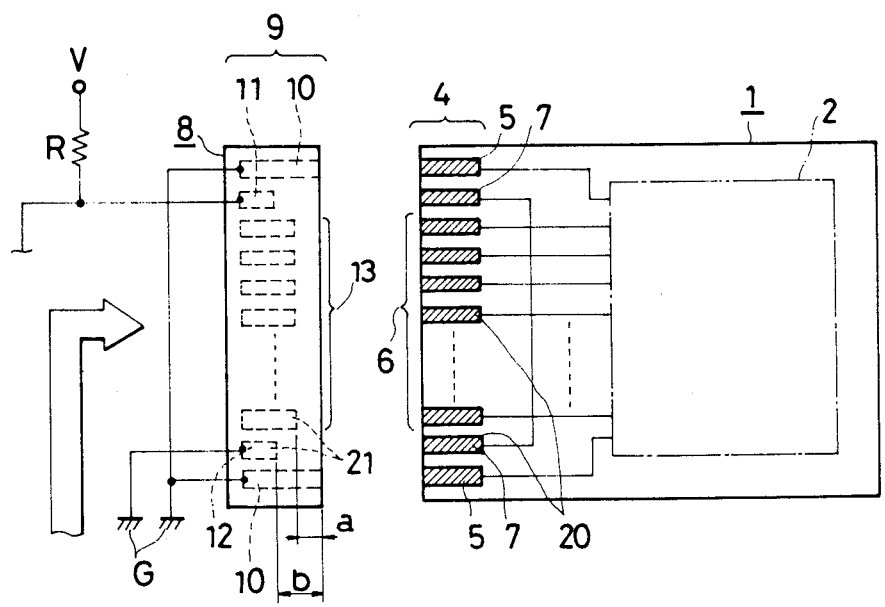
FIG. 3 is a block diagram showing a memory unit and a connector, incorporating a connecting structure, in a second embodiment, according to the present invention.

A connecting structure, in a second embodiment, according to the present invention will be described hereinafter with reference to FIG. 3, in which parts the same or corresponding to those previously described with reference to the first embodiment are denoted by the same reference characters and the description thereof will be omitted.

In the second embodiment, a terminal array 4 including grounding terminals 5, information signal terminals 6 and check terminals 7 is disposed in a memory unit 1 in flush with one side 3 of the memory unit 1. A terminal array 9 of a connector 8 has the same constitution as that of the terminal array 4 of the memory unit 1 of the first embodiment. That is, in the connector 8, grounding terminals 10 are disposed in flush with the outer surface of a memory unit receiving opening 22 formed in the connector 8, reception information signal terminals 13 are disposed back by a distance a from the outer surface of the memory unit receiving opening 22, and reception check terminals 11 and 12 are disposed back by a distance b from the outer surface of the memory unit receiving opening 22.

In inserting the memory unit 1 in the connector 8, similarly to those of the first embodiment, first the grounding terminals 5 are brought into contact with the reception grounding terminals 10, then the information signal terminals 6 are brought into contact with the reception information signal terminals 13 and, finally, the check terminals 7 are brought into contact with the reception check terminals 11 and 12. Accordingly, upon the insertion of the memory unit 1 in the connector 8, the static electricity accumulated in the memory unit 1 is discharged surely to a ground G, and information transmission without securely connecting the memory unit 1 to the connector 8 is obviated.

What is claimed is:

1. A connecting structure for electrically connecting a memory unit to an external control circuit, said connecting structure comprising:
 a connector means having a plurality of in-line reception information signal terminals arranged in a straight line and connected to a control circuit, reception grounding terminals disposed at the opposite sides of said plurality of in-line reception information signal terminals, respectively, and connected to a ground; and
 a memory terminal arrangement provided in a memory unit having an optionally reloadable semiconductor memory and adapted to be inserted in said connector, said memory terminal arrangement comprising:
 a plurality of in-line output information signal terminals to be respectively connected to said reception information signal terminals, said in-line output signal terminals arranged along one side of said memory unit; and, output grounding terminals disposed at the opposite ends of said plurality of said output information terminals, respectively, so as to be connected to said reception grounding terminals prior to said output information signal terminals being connected to said reception information signal terminals when said memory unit is inserted in said connector means.

2. A connecting structure according to claim 1 wherein the reception information signal terminals and reception grounding terminals of said connector are arranged in a straight line, and wherein the said output grounding terminals of said terminal arrangement project beyond and perpendicular to said plurality of in-line output information signal terminals in a direction away from said memory unit and towards said connector means when said memory unit is inserted in said connector means.

3. A connecting structure according to claim 1 wherein said output information signal terminals and output grounding terminals of said terminal arrangement of said memory unit are arranged in a straight line, and the reception grounding terminals of said connector project beyond and perpendicular to said reception information signal terminals so that said reception grounding terminals of said connector contact said output grounding terminals prior to said reception information signal terminals contacting said output information signal terminals upon insertion of said memory unit in said connector means.

4. A connecting structure for electrically connecting a memory unit to an external control circuit, said connecting structure comprising:

a connector having a plurality of in-line reception information signal terminals connected to a control circuit, reception check terminals connected to said control circuit and reception grounding terminals connected to a ground; and a terminal arrangement provided in a memory unit having an optionally reloadable semiconductor memory, said terminal arrangement including output information signal terminals to be connected to said reception information signal terminals, respectively, arranged along one side of said memory units, output grounding terminals to be connected to said reception grounding terminals, respectively, arranged along said one side of said memory units, and, output check signal terminals arranged so as to be connected to said reception check signal terminals after said output information signal terminals have been connected to said reception information signal terminals, respectively and after said output grounding terminals have been connected to said connection grounding terminals.

5. A connecting structure according to claim 4 wherein said output check signal terminals are arranged in a pair at the opposite ends of said terminal arrangement provided in said memory unit, respectively.

6. A connecting structure according to claim 4 wherein said reception information signal terminals and said reception check signal terminals of said connector are arranged in a straight line and wherein said output information signal terminals and said grounding terminals project beyond and perpendicular to said output check signal terminals in a direction away from said memory unit and in a direction of insertion of said memory unit in said connector.

7. A connecting structure according to claim 6 wherein said output grounding terminals of said terminal arrangement of said memory unit are projected beyond and perpendicular to said output information signal terminals of said terminal arrangement in a direction away from said memory unit and in a direction of insertion of said memory unit in said connector.

8. A connecting structure according to claim 4 wherein said output information signals, said output check signal terminals and said output grounding terminals of said terminal arrangement of said memory unit are arranged in a straight line and wherein said reception information signal terminals and said reception grounding terminals of said connector project beyond and perpendicular to said reception check signal terminals of said connector in a direction of insertion of the memory unit in said connector.

9. A connecting structure according to claim 8 wherein said reception grounding terminals of said connector project beyond and perpendicular to said reception information signal terminals in a direction of insertion of the memory unit in said connector.

10. A memory system comprising:

a connector including a plurality of reception information signal terminals arranged in a straight line and connected to a control circuit, reception check signal terminals connected to said control circuit, and reception grounding terminals connected to a ground;

a switching device interposed between an electrically connected to said control circuit and to said reception information signal terminals;

a delay circuit interposed and electrically connected to said control circuit and to said reception check signal terminals, and adapted to provide a signal to close said switching circuit upon the reception of a connection signal through said reception check signal terminal; and a memory unit including a reloadable semiconductor memory, a terminal arrangement disposed on one side of said reloadable semiconductor memory and including output information terminals to be connected to said reception information signal terminal, respectively, output grounding terminals to be connected to said reception grounding terminals, and output check signal terminals arranged so as to be connected to said reception check signal terminals after the output information signal terminals have been connected to said reception information signal terminals, respectively, and after said output check signal terminals have been connected to said reception check signal terminals, respectively.

11. A memory system according to claim 10 wherein said reception information signal terminals and said reception check signal terminals of said connector are arranged in a straight line with said output information signal terminals and said output grounding terminals projecting beyond and perpendicular to said output check signal terminals of said memory unit in a direction away from said memory unit and in the direction of insertion of said memory unit in said connector.

12. A memory system according to claim 11 wherein said output grounding terminals of said memory unit project beyond and perpendicular to said output information signal terminals of said memory unit in a direction of insertion of said memory unit in said connector.

13. The memory system according to claim 10 wherein said output information signal terminals, said output check terminals and said output grounding terminals of said memory unit are arranged in a straight line and wherein said reception information signal terminals and said reception grounding terminals of said connector project beyond and perpendicular to said reception check signal terminals of said connector in a direction which is both away from said memory unit and in the direction of insertion of said memory unit in said connector.

14. A memory system according to claim 13 wherein said reception grounding terminals of said connector project beyond and perpendicular to said reception information signal terminals of said connector in a direction of insertion of said memory unit in said connector.

* * * * *